US011282811B2

(12) United States Patent
Boo et al.

(10) Patent No.: US 11,282,811 B2
(45) Date of Patent: Mar. 22, 2022

(54) INTEGRATED CIRCUIT WIRE BONDED TO A MULTI-LAYER SUBSTRATE HAVING AN OPEN AREA THAT EXPOSES WIRE BOND PADS AT A SURFACE OF THE INNER LAYER

(71) Applicant: Micron Technology, Inc., Boise, ID (US)

(72) Inventors: Kelvin Tan Aik Boo, George Town (MY); Chin Hui Chong, Braddell Hill (SG); Seng Kim Ye, Fernvale Close (SG); Hong Wan Ng, Singapore (SG); Hem P. Takiar, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/931,388

(22) Filed: May 13, 2020

(65) Prior Publication Data

US 2021/0358888 A1 Nov. 18, 2021

(51) Int. Cl.
*H01L 25/065* (2006.01)
*H01L 23/498* (2006.01)
(Continued)

(52) U.S. Cl.
CPC .... *H01L 25/0657* (2013.01); *H01L 23/49811* (2013.01); *H01L 23/49822* (2013.01);
(Continued)

(58) Field of Classification Search
CPC ......... H01L 25/50; H01L 24/48; H01L 24/85; H01L 25/0657; H01L 2225/0651;
(Continued)

(56) References Cited

U.S. PATENT DOCUMENTS

| 9,345,136 | B1 | 5/2016 | Kim | |
|---|---|---|---|---|
| 2007/0085194 | A1* | 4/2007 | Mao | H05K 1/0373 257/700 |
| 2016/0172336 | A1* | 6/2016 | Schenck | H01L 25/105 257/777 |

FOREIGN PATENT DOCUMENTS

| CN | 101958292 A | 1/2011 |
|---|---|---|
| WO | 1996023396 A1 | 8/1996 |
| WO | 2005036610 A2 | 4/2005 |

OTHER PUBLICATIONS

International Search Report and Written Opinion dated Sep. 20, 2021, for International Application No. PCT/US2021/0320725.

* cited by examiner

*Primary Examiner* — Jasmine J Clark
(74) *Attorney, Agent, or Firm* — Lowenstein Sandler LLP (57) ABSTRACT

An apparatus includes an integrated circuit and a substrate coupled to the integrated circuit. The substrate includes a primary layer having a first surface that is a first external surface of the substrate. The primary layer includes an open area that extends through the primary layer to an inner layer of the substrate. The substrate includes a secondary layer. The inner layer is located between the primary layer and the secondary layer. The inner layer includes a third surface that is orientated approximately parallel to the first surface of the primary layer. A portion of the third surface of the inner layer is exposed via the open area of the primary layer. A first plurality of wire bond pads are disposed on the portion of the third surface of the inner layer that is exposed via the open area of primary layer.

20 Claims, 5 Drawing Sheets

(51) Int. Cl.
*H01L 23/00* (2006.01)
*H01L 25/00* (2006.01)

(52) U.S. Cl.
CPC .............. *H01L 24/48* (2013.01); *H01L 24/85* (2013.01); *H01L 25/50* (2013.01); *H01L 2224/48228* (2013.01); *H01L 2224/48229* (2013.01); *H01L 2224/85045* (2013.01); *H01L 2225/0651* (2013.01); *H01L 2225/06562* (2013.01)

(58) Field of Classification Search
CPC ..... H01L 2225/06562; H01L 23/49822; H01L 23/49811; H01L 2224/48228; H01L 2224/48229
See application file for complete search history.

INTEGRATED CIRCUIT WIRE BONDED TO A MULTI-LAYER SUBSTRATE HAVING AN OPEN AREA THAT EXPOSES WIRE BOND PADS AT A SURFACE OF THE INNER LAYER

TECHNICAL FIELD

Embodiments of the disclosure relate generally to semiconductor assembly, and more specifically, relate to using a multi-layer substrate having an open area that exposes wire bond pads on a surface of an inner layer of the substrate.

BACKGROUND

Integrated circuit (IC) die stacking can include a process of mounting multiple die above one another where the stacked die are eventually packaged in a single semiconductor package to form a discrete electrical device. The adoption of stacked IC die continues to increase in an effort to reduce the overall electrical device footprint and to improve the electrical performance of the electrical device.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Die stacking includes fabricating one or more wafers with IC dice. The wafers can be placed on a carrier and diced to form singulated IC dice. The singulated IC dice are picked and sorted to find functional "good" die and to remove non-functional "bad" die. A first functional IC die can be disposed (e.g., bonded as a flip-chip) on a multi-layer substrate (herein after referred to as "substrate" herein) and coupled thereto. A second IC functional die can be stacked above the first functional IC die. A wire bond operation can be performed on the second functional IC die. The wire bond operation can bond a first end of a conductive wire to a die pad of the second functional IC die and bond a second end of the conductive wire to a wire bond pad on the surface for the primary layer. A wire bond pad can be surface area of a substrate that is designated for an external electrical contact, such as a conductive wire of a wire bond. The wire bond operation can be repeated for other die pads of the second functional IC die. In instances were another functional IC die is stacked above the second functional die the wire bond operation can be repeated.

A multi-layer substrate can have three or more layers, such a primary layer, one or more inner layers, and a secondary layer. A primary layer can be the top-most layer above which one or more functional IC dice are stacked. The secondary layer can be the bottom-most layer of the substrate and include multiple electrical contacts that couple to the IC dice to external signals. The one or more inner layers can be disposed between the primary layer and the secondary layer of the substrate.

As integrated circuit have become more complex, the number of wire bond pads on the substrate has increased. In particular, using multiple IC dice in a single device has greatly increased the number of die pads in a device, as well as the number of wire bond pads on a substrate. The wire bond pad pitch (i.e., distance between the center of a wire bond pad and the center of an adjacent wire bond pad) has decreased in an effort to address the increasing number of wire bond pads, but has been constrained by multiple factors. When wire bond pads get too small, manufacturability become more challenging. For instance, the wire bond equipment can lack the precision to perform high-yield wire bonding at tight wire bond pad pitches. In another instance, etching wire bond pads and associated connecting wire traces (collectively referred to as "wire bond fingers" herein) with tight wire bond pad pitches can be difficult to fabricate during substrate fabrication. Moreover, tight wire bond pad pitches can contribute to parasitic effects, such as parasitic resistance, parasitic capacitance, and cross-talk.

In some systems, the wire bond pads are positioned at angles (e.g., like a fan rather than orientated in a horizontal row) on the primary layer so as to keep the requisite pitch between the wire bond pads. However, having wire bond pads positioned at angles results in an inefficient use of substrate area and creates additional manufacturability challenges. In other systems, different rows of wire bond pads are offset on the primary layer to keep the requisite pitch between the wire bond pads. However, the connecting wire traces of one row of wire bond pads can run between the wire bond pads of another row of wire bond pads, which also contributes to parasitic effects.

Aspects of the disclosure address the above and other deficiencies by coupling an integrated circuit to a multi-layer substrate having an open area that exposes wire bond pads at an inner layer. The substrate can have a primary layer, a secondary layer, and one or more inner layers located between the primary layer and the secondary layer. The primary layer includes an open area that extends through the primary layer to an inner layer of the substrate. A portion of the surface of the inner layer is exposed through the open area of the primary layer. In some embodiments, wire bond pads are disposed on the primary layer and on the portion of the surface of the inner layer that is exposed through the open area of the primary layer. In some embodiments, the conductive wires can be bonded to one or more IC die of the integrated circuit and the wire bond pads at the inner layer. In some embodiments, other conductive wires can be bonded to one or more IC die of the integrated circuit and the wire bond pads of the primary layer.

Advantages of the disclosure include, but are not limited to, improved manufacturability and device yield. In particular, aspects of the disclosure allow more wire bond pads having a requisite pitch to be disposed on a substrate where a group of wire bond pads are disposed on the primary layer and another group of wire bond pads are disposed on the inner layer. Further the wire traces of the two groups of wire bond pads are on different layers and separated by a dielectric material of the adjacent layers, which reduces parasitic effects.

Figure 1A:
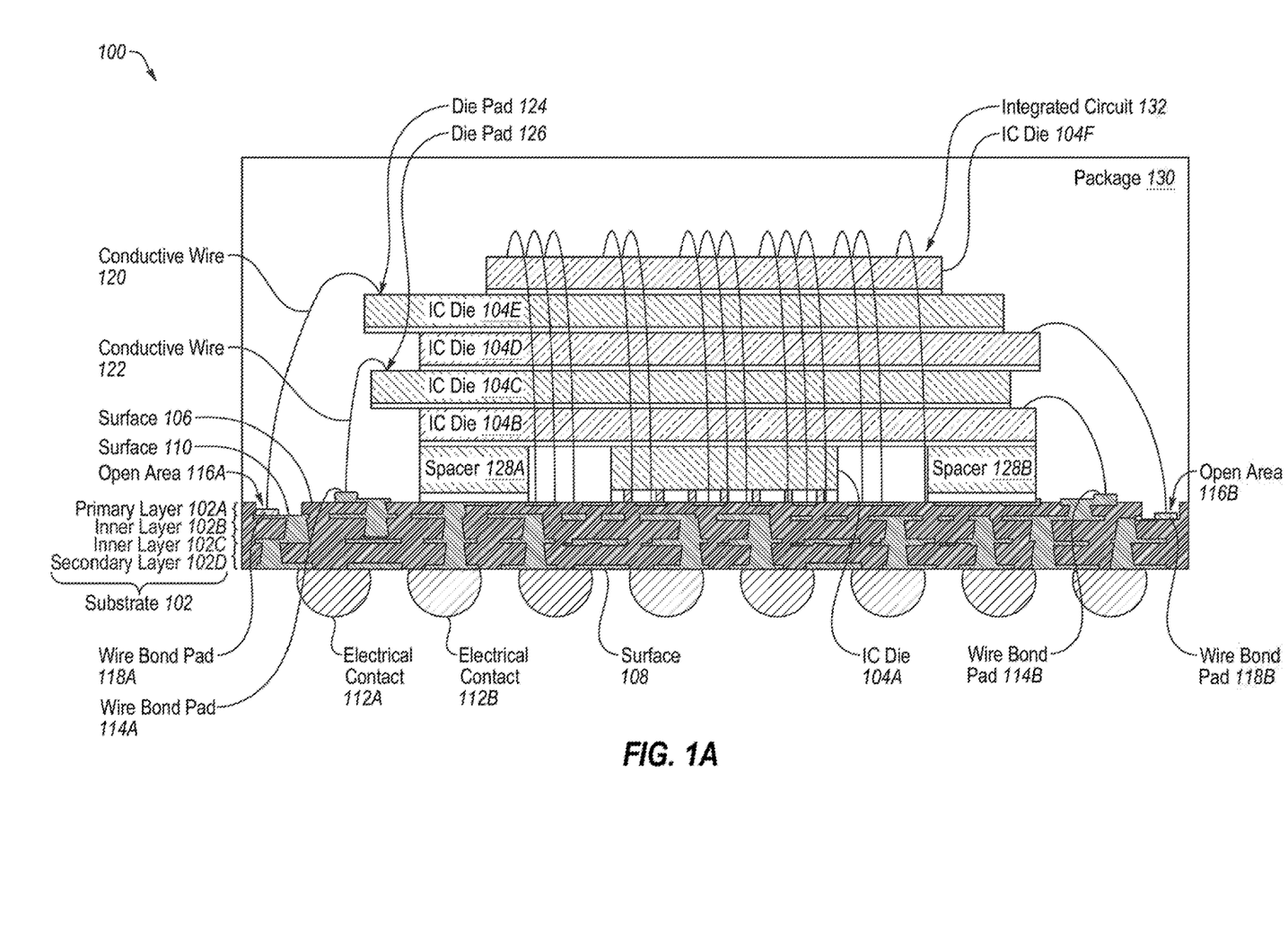
FIG. 1A illustrates a profile view of an integrated circuit with wire bonds to the primary layer and inner layer of a multi-layer substrate, in accordance with some embodiments of the disclosure.

FIG. 1A illustrates a profile view of an integrated circuit with wire bonds to the primary layer and inner layer of a multi-layer substrate, in accordance with some embodiments of the disclosure.

FIG. 1A illustrates an integrated circuit device 100. The integrated circuit device 100 includes integrated circuit 132 that is disposed on a multi-layer substrate 102 (also referred to as "substrate" herein). The integrated circuit 132 is encased in a packaging material, such as a ceramic or plastic material (e.g., epoxy molding compounds), as illustrated by package 130.

The integrated circuit 132 can include one or more integrated circuit die. In some embodiments, the integrated circuit 132 is a stacked integrated circuit, as illustrated in FIG. 1A. Integrated circuit 132 includes integrated circuit die 104A, 104B, 104C, 104D, 104E and 104F (generally referred to as "integrated circuit dice 104" herein). Integrated circuit dice 104 can include one or more types of integrated circuits. For example, integrated circuit device 100 can be a memory device that can include a logic die (e.g., integrated circuit die 104A) and one or more volatile or non-volatile memory dice. For instance, integrated circuit die 104B-104E can be static random access memory (SRAM) die and integrated circuit die 104F can be NAND flash memory die. As illustrated, supports, such as spacer 128A and 128B, can be used in the die stack to help distribute the load of overhanging dice. The supports can include a dielectric material. In some embodiments, integrated circuit die 104A can be a flip-chip that is directly bonded to the primary layer 102A of the substrate 102. In some embodiments, between one or more of the integrated circuit dice 104 can be a dielectric layer (e.g., underfill material) that helps electrically insulate the integrated circuit dice 104 from one another.

In some embodiments, one or more of the integrated circuit dice 104 can have one or more die pads, illustrated with die pad(s) 124 of integrated circuit die 104E and die pad(s) 126 of integrated circuit die 104C. A die pad can be located at the surface, such as the top surface, of the respective integrated circuit dice 104. A die pad (also referred to as a "contact pad" herein) can be a surface area of an integrated circuit die that is designated for an external electrical contact (e.g., to electrically couple an integrated circuit die to another component). In some embodiments, the die pads are coated with a conductive material, such as gold or gold alloy.

In some embodiments, substrate 102 includes three or more layers. As illustrated, substrate 102 includes primary layer 102A, inner layer 102B, inner layer 102C, and secondary layer 102D (collectively referred to as "substrate 102" herein). In some embodiments, one or more of various layers of the substrate 102 can include a dielectric material (e.g., epoxy resin with glass fibers) that electrically insulate a layer from adjacent layers. In some embodiments, layer can include conductive leads or traces on a dielectric material and conductive vias within a dielectric material of the layer that can electrically couple the conductive leads or traces of one layer to those of another layer. In some embodiments, one or more layers (or surface thereof) can be orientated approximately parallel to one another. Approximately parallel can refer to +/−10 degrees from absolute parallel or larger to take into account of manufacturing tolerances.

In some embodiments, the primary layer 102A includes a surface 106 that is an external surface of substrate 102. The primary layer 102A can include one or more open areas, such as open area 116A and open area 116B (generally referred to as "open area 116" herein), that extend through the surface 106 of the primary layer 102A to an inner layer of the substrate 102. Each open area 116 can expose a portion of the surface of the respective inner layer. The non-exposed surface of the respective inner layer can be bonded to the above layer, such as the primary layer 102A. In the illustrated example, surface 110 of inner layer 102B is exposed through open area 116 of primary layer 102A.

The secondary layer 102D of the substrate 102 includes surface 108 that is an external surface of the substrate 102. In some embodiments, the secondary layer 102D includes one or more electrical contacts, such as electrical contact 112A and electrical contact 112B. The electrical contacts of integrated circuit device 100 are illustrated as a ball grid array for purposes of illustration, rather than limitation. In some embodiments, other types of electrical contacts can be implemented on the secondary layer 102D. In some embodiments, the electrical contacts can be configured, using conductive vias, to be electrically coupled to one or more of the above layers, and to couple signals to and from the electrical contacts and the integrated circuit dice 104.

In some embodiments, the substrate 102 contains one on ore more inner layers. Although two inner layers, inner layer 102B and inner layer 102C, are illustrated, in some embodiments any number of inner layers can be implemented according to aspects of the disclosure. The inner layers 102B and 102C are located between the primary layer 102A and the secondary layer 102D. Inner layer 102B includes one or more portions of a surface that are exposed via respective one or more open areas of the primary layer 102A (described further below).

In some embodiments, a portion of the surface of the inner layer that is exposed through the open area in the primary layer 102A can include one or more wire bond pads that are disposed on the exposed portion(s) of the surface of the inner layer. For example, wire bond pad(s) 118A is disposed on the surface 110 (e.g., portion of the surface) of inner layer 102B that is exposed through open area 116A. Wire bond pad(s) 118B is disposed on the portion of the surface of inner layer 102B that is exposed through open area 116B. A wire bond pad can be a surface area of a substrate that is designated for an external electrical contact (e.g., to electrically couple the substrate to another component, such as an integrated circuit die) such as a conductive wire of a wire bond. In some embodiments, the primary layer 102A can include one or more wire bond pads, such as wire bond pad(s) 114A and wire bond pad(s) 114B. In some embodiments, a solder material, such as a nickel-gold alloy, is disposed above a wire bond pad. For instance, a wire bond pad can be coated with a conductive solder material that facilitates the wire bond operation (described further below). The solder material is used to bond a wire bond pad with an end of a conductive wire.

In some embodiments, the one or more integrated circuit dice 104 of integrated circuit 132 are wire bonded to the substrate 102. The wire bond electrically couples the respective integrated circuit dice 104 to the substrate 102 using conductive wires, such as conductive wire(s) 120 and conductive wire(s) 122. In some embodiments, a conductive wire has two ends. In some embodiments, a first end of a conductive wire is bonded to a die pad and a second end of the conductive wire is bonded to a wire bond pad disposed on the surface 106 of the primary layer 102A. For example, an end of conductive wire 122 is bonded to die pad 126 of integrated circuit die 104C and the opposite end of conductive wire 122 is bonded to the wire bond pad 114A at the surface 106 of primary layer 102A. In some embodiments, a first end of a conductive wire is bonded to a die pad and a second end of the conductive wire is bonded to a wire bond pad disposed on the surface 110 of an inner layer, such as inner layer 102B. For example, an end of conductive wire 120 is bonded to die pad 124 of integrated circuit die 104E and the opposite end of conductive wire 120 is bonded to the wire bond pad 118A on the surface 110 of inner layer 102B.

In some embodiments, a subset (e.g., 112B) of the electrical contacts of the secondary layer 102D is configured to couple (e.g., using vias through the substrate 102) to the wire bond pads (e.g., 114A and 114B) disposed on the surface 106 (e.g., an external surface) of the primary layer 102A. It can be noted that an electrical contact on the secondary layer 102D can be coupled to one or more wire bond pads (e.g., on the surface 106 or 108 or a combination thereof). In some embodiments, another subset (e.g., 112A) of the electrical contacts of the secondary layer 102D is configured to couple to the wire bond pads (e.g., 118A and 118B) disposed on the portion of the surface (e.g., an external surface) of the inner layer exposed through an open area in the primary layer 102A. For example, wire bond pad 118 on the surface 110 of the inner layer 102B is coupled (e.g., electrically coupled) to electrical contact 112A.

Although illustrated having one or more portions of the surface of inner layer 102B exposed via the open areas of the processing logic, in some embodiments any inner layer of substrate 102 can have an exposed portion of a surface. For example, inner layer 102C can have a portion of its surface exposed through an open area of the primary layer 102A and another corresponding open area in inner layer 102B. The corresponding open area of inner layer 102B can have an open area that overlaps (partially or completely) with the open area of the primary layer 102A.

In some embodiments, a conductive layer (e.g., a copper sheet) is disposed above an inner layer to provide shielding from electromagnetic (EM) interference. For example, the conductive shielding layer can be coupled to a ground potential to shield adjacent layers from EM interference. Returning to the example where inner layer 102B has a corresponding open area that exposes a portion of the surface of inner layer 102C, a conductive shield layer can be disposed between inner layer 102C and inner layer 102B to reduce the EM interference between inner layer 102B and inner layer 102C. It can be noted that the conductive shielding layer can be patterned such that the conductive shielding layer allows vias or open area(s) to pass through.

Figure 1B:
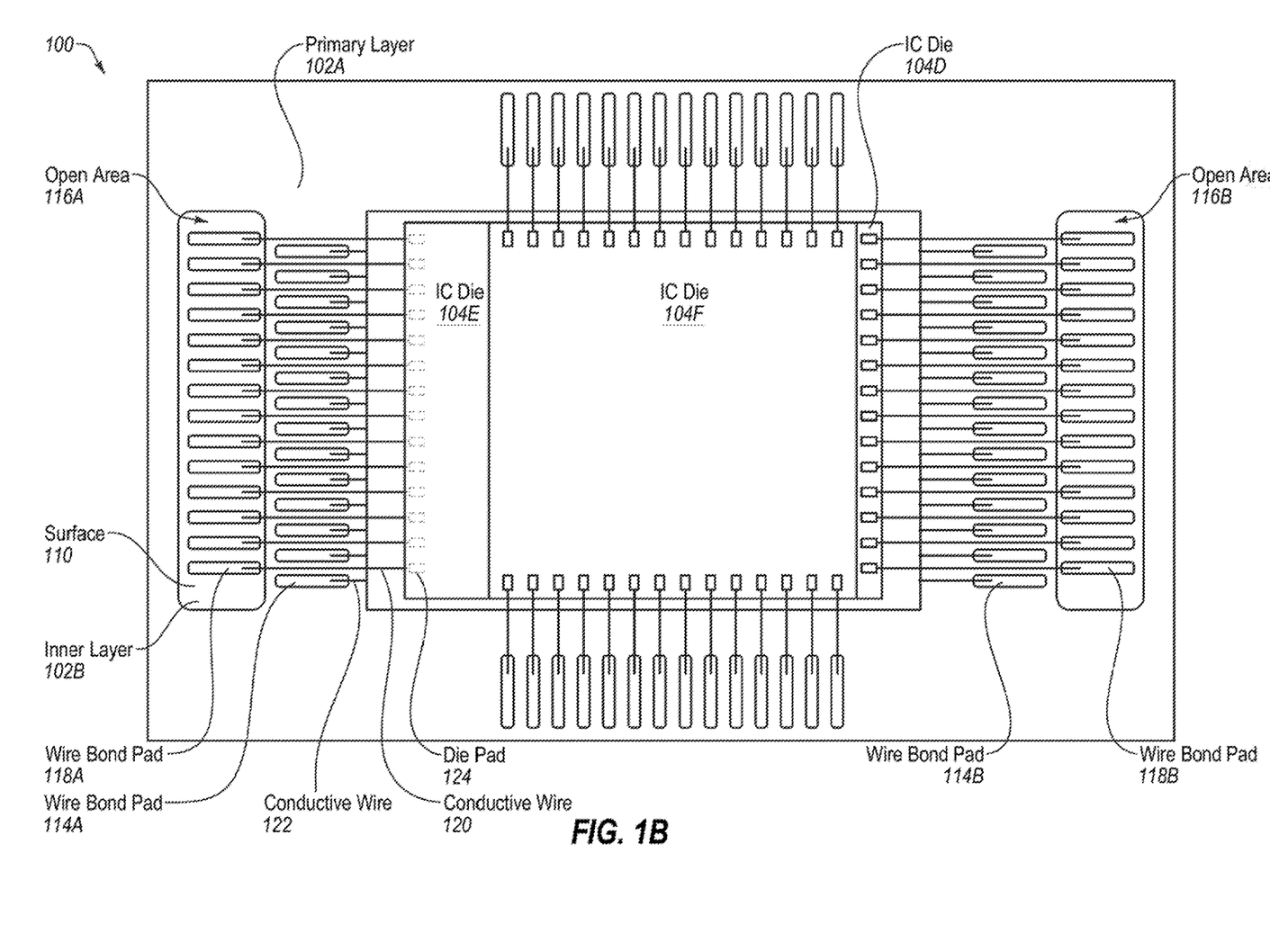
FIG. 1B illustrates a top-down view of an integrated circuit with wire bonds to the primary layer and inner layer of a multi-layer substrate, in accordance with some embodiments of the disclosure.

FIG. 1B illustrates a top-down view of an integrated circuit with wire bonds to the primary layer and inner layer of a multi-layer substrate, in accordance with some embodiments of the disclosure. Components of FIG. 1A are considered to be part of integrated circuit device 100 of FIG. 1B, unless otherwise described.

From the top-down view of integrated circuit device 100, integrated circuit die 104F and integrated circuit die 104E can be seen, while the other integrated circuit dice 104 of integrated circuit device 100 are obscured from view. Open area 116A and open area 116A are shown, each with multiple wire bond pads 118A and wire bond pads 118B, respectively. In some embodiments, the open area(s) are surrounded by the primary layer (e.g., do not extend to the edges of the primary layer 102A). In other embodiments, the position, size and shape of the open areas can be different than illustrated. For example, the location of the open area 116A and the adjacent wire bond pads 114A can be switched in some embodiments. In other embodiments, the one or more sides of the open area can extend to the respective sides of the primary layer 102A.

Aspects of the disclosure allow for wire bond pads to be laid out such that the pitch between the wire bond pads is relatively tight (e.g., close) compared to other systems. As illustrated in FIG. 1B, the row of wire bond pads illustrated by wire bond pads 118A and the row of wire bond pads illustrated by wire bond pads 114A are enabled to be tightly pitched at least because the rows of wire bond pads are fabricated on different layers of the substrate 102. For example, the traces (not shown, but can be approximately illustrated as located on a surface of a layer directly beneath the conductive wire) that are associated with the row of wire bond pads illustrated by wire bond pads 118A can be fabricated on the inner layer, which can electrically isolate (e.g., decouple) the traces from the above row of wire bond pads illustrated by bond pads 114A. If for example, the row of wire bond pads illustrated by bond pads 118A and the row of wire bond pads illustrated by bond pads 114A were fabricated on a same layer, the pitch between the respective wire bond pads would increase to compensate for the electrical coupling between traces that are associated with the row of wire bond pads illustrated by bond pads 118A and the wire bond pads 114A. Additionally, if the pitch between wire bond pads 118A and 114A were to increase because the rows of wire bond pads were fabricated on a same layer or fabricated to be in a single row, wire bonding from the die to the wire bond pads would be challenging at least because the wire bonding would be performed at many different angles with respect to the die pads.

In some embodiments, wire bond pads 118A are arranged in a first row of wire bond pads. Wire bond pads 114A are arranged in a second row of wire bond pads. The alignment of wired bond pads 118A of the first row of wire bond pads is offset from corresponding wire bond pads 114A of the second row of wire bond pads. For example, a line drawn from the center line of wire bond pad of wired bond pads 118A would be located between two corresponding wire bond pads of wire bond pads 114A (e.g., illustrated approximately by the conductive wire). In some embodiments, a width of a wire bond pad of wired bond pads 118A is equal to or greater than the distance between an side of a first wire bond pad of wire bond pads 114A and a directly adjacent side of a second adjacent wire bond pad of wire bond pads 114A. For instance, if the wire bond pads 118A and 114A where align in a single row with the same spacing, the sides of the bond pads would either touch or overlap.

As illustrated, numerous conductive wires are wire bonded from the integrated circuit dice 104 to respective wire bond pads of the primary layer 102A or inner layer 102B. A wire bond operation can include a welding process (e.g., solid phase welding process) where two conductive (e.g., metallic) materials (e.g., an end of a conductive wire and die pad or wire bond pad) are brought into contact. Responsive to the bringing the two material materials into contact, electron sharing or inter-diffusion of atoms occurs and results in a wire bond. In an illustrative wire bond operation example, a capillary tool can hold a conductive wire (e.g., closed position to pull the wire from a spool). An electric arc can arc cut the end of the conductive wire and form a free air ball (e.g., ball of conductive material) at the end of the conductive wire. The capillary tool can press the free air ball onto a die pad (e.g., die pad 124 of integrated circuit die 104E) and use one or more of mechanical, thermal or ultrasonic energy to form a ball bond on the die pad with the end of the conductive wire. The clamp of the capillary tool opens and as the capillary tool moves to the associated wire bond pad (e.g., wire bond pad 118A on the surface 110 of the inner layer 102B) the conductive wire feeds through the capillary tool. The capillary tool contacts the respective wire bond pad and uses one or more of mechanical, thermal or ultrasonic energy to form a ball bond on the wire bond pad with the opposite end of the conductive wire. The wire bond operation can repeated for any die pad and wire bond pad pair.

In some embodiments, a substrate with one or more open areas, such as substrate 102, can be fabricated using one or more substrate fabrication operations. The fabrication operations of a 4-layer substrate will be described for purposes of illustration rather than limitation. The fabrication operations can be used to fabricate a substrate with any number of layers.

In a first substrate fabrication operation, the inner layers can be patterned. A panel of laminate (e.g., core) can include epoxy resin with glass fiber that is sandwiched between two conductive sheets (e.g., copper sheets). The core can be fabricated to be the two inner layers of the substrate. Photo resist material is applied to both sides of the core (e.g., on the copper sheets) and a mask is applied with the appropriate pattern or layout to each side. In some embodiments, one or more portions of the surface of an inner layer are patterned to have wire bond pads (e.g., the applied mask layouts can have the wire bond pads pattern thereon). The resist material is light treated (e.g., ultraviolet light treatment) to cure (e.g., hardened) the resist material in the pattern of the applied masks. The unhardened resist is removed. In some embodiments, the hardened resists remains on the copper that is to be retained. The opposite can occur in other embodiments. It can be noted that positive or negative resists can be used depending on the implementation.

In a second substrate operation, the inner layers are etched. The core material can be have the unwanted copper etched away from the core. For example, the core with the hardened resist can be put in an alkaline solution to etch away the unwanted copper, and leave behind the copper under the hardened resist. After the unwanted copper is removed, the hardened resist is removed leaving the patterned core (e.g., wire bond pads on the inner layer).

In a third substrate operation, the primary layer and secondary layer are formed above and below respectively, the patterned core. For example, a thin copper foil is laid down and sheets of pre-impregnated material (referred to as "pre-preg" herein) are positioned above the copper foil. Pre-preg can be sheets of fiber (e.g., glass cloth) pre-impregnated with uncured epoxy resin. The bottom copper foil and pre-preg can form the secondary layer (or primary layer depending on the orientation of the patterned core). The patterned core can be placed on the uppermost sheet of pre-preg. More sheets of pre-preg can be stacked upon the patterned core and another sheet of copper foil is placed on the top-most sheet of pre-preg. The latter positioned sheets of pre-preg and copper foil can become the primary layer (or secondary layer depending on the orientation of the patterned core). The stack of materials can be heat pressed using a heated platen so that the materials are bonded together. The heat can melt the pre-preg and the applied pressure can help bond the material together to form the substrate.

In embodiments where an open area is created in the primary layer, the top most pre-preg can be removed in a location where the open area is to be formed. The pre-preg can be removed using a laser source (or a saw) to cut the pre-preg, for example. In some embodiments, the top most sheet of cooper can also be cut to remove the copper in the location where the open area is to be formed. After the pre-preg and copper are cut to include the open area, the pre-preg and copper sheet is positioned above the core and heat pressed, as described above.

In a fourth substrate operation, vias can be formed in the substrate. In some embodiments, the substrate can be drilled with holes for any vias that are to be formed in the substrate. A copper deposition technique, such as electroless copper deposition, can be used to chemically deposit copper on the walls of any hole to create plated through-holes.

In a fourth substrate operation the outer layers, such as the primary layer and secondary layer, can be patterned. In some embodiments, photo resist material is applied to both outer layers of the substrate and a mask is applied to each side with the appropriate pattern or layout. The resist is light treated to be cured in the patterns of the applied masks. The unhardened resists is removed. In some embodiments, the portions of the outer copper layers that are to be retained are exposed by the removing the resist and subsequently plated (as described below). In some embodiments, the resist material can also be applied to the portion of the surface of the inner layer that is exposed through the open area. Even though the wire bond pads have already been patterned, the mask can be patterned so that the wire bond pads of the inner layer are exposed with the removal of the unhardened resist. In some embodiments, the resist in the open area but not above the wire bond pads can hardened and remain after the unhardened resist is removed.

In a fifth substrate operation, the outer layers can plated and etched. In some embodiments, the substrate can be plated with copper using an electroplating operation. In the electroplating operation copper is deposited on the walls of the holes (e.g., vias) as well as on the areas where the photoresist has been removed (e.g., tracks). After the copper is deposited, a layer of tin can be deposited on the newly deposited copper. The tin layer can work as an etch resist. The remaining photo resist is removed to expose the underlying copper. The underlying copper can be removed using for example, alkaline chemical removal. After the underlying copper is removed the tin plating can be removed to expose the desired copper pattern.

In a sixth substrate operation, the substrate can be covered with a solder mask. The substrate can be cleaned and brushed, and coated with an epoxy solder mask ink (e.g., green coating). The substrate can be imaged again using a mask. The epoxy solder mask ink can act as a resist. The pattern can pattern the copper that is to be exposed on the external surfaces of the substrate, such as the wire bond pads of the inner layer. The unhardened resist is striped off. The remaining epoxy solder mask ink can be cured using a heating process.

In a seventh substrate operation, the exposed copper on the outer layers (and portion(s) of the surface of the inner layer) can be plated. A chemical process can be used to plate the exposed copper. For example, an electroless gold over nickel (e.g., first nickel, then gold) process can plate the wire bond pads, such as the wire bond pads on the inner layer and primary layer.

Figure 2:
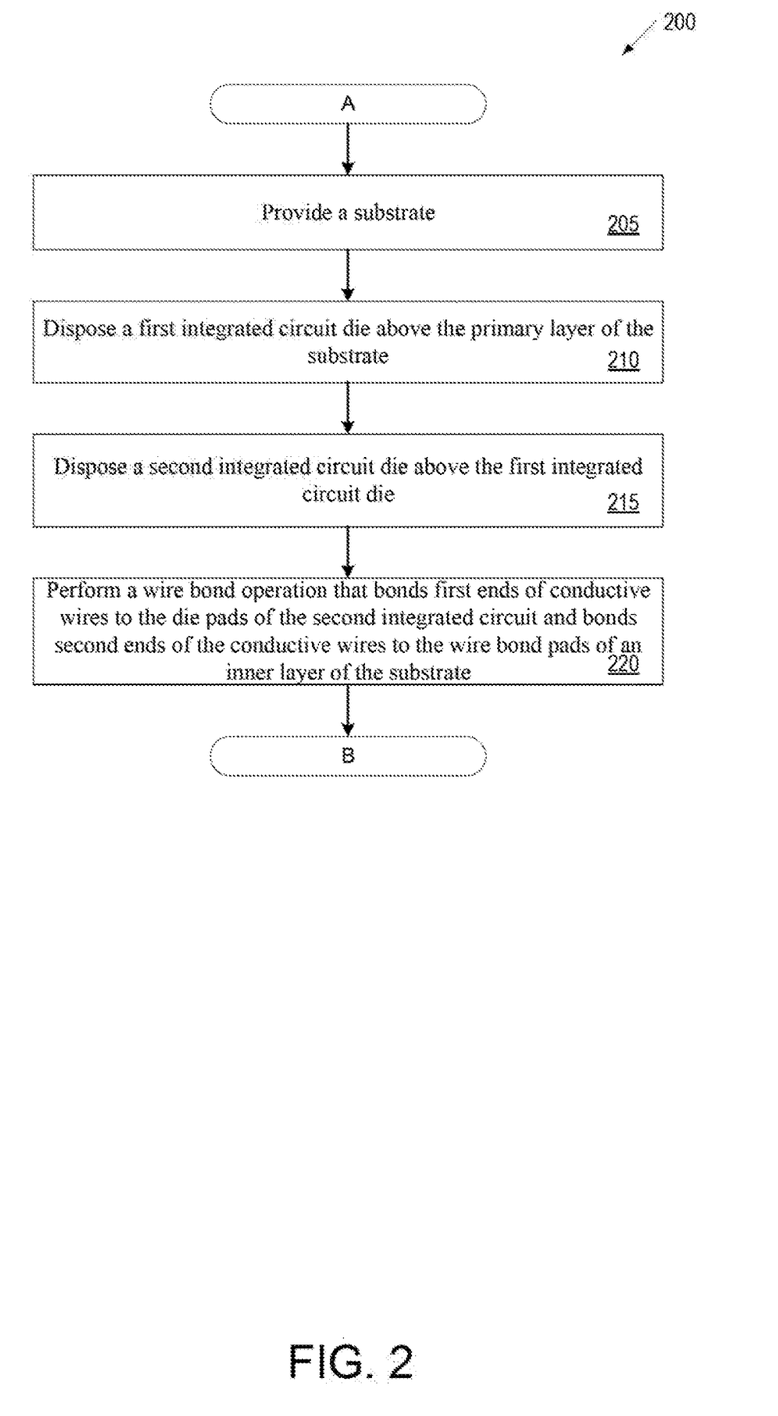
FIG. 2 illustrates a flow diagram of using a multi-layer substrate having an open area that exposes a portion of a surface of an inner layer of the substrate, in accordance with some embodiments of the disclosure.

Elements of FIGS. 1A and 1B may be described below to help illustrate method 200. It may be noted that method 200 may be performed in any order and may include the same, different, more, or fewer operations. It may be further noted that method 200 may be performed by one or more pieces of semiconductor fabrication equipment or fabrication tools or semiconductor packaging tools or semiconductor assembly tools or wire bonding tools, hereinafter referred to as fabrication equipment.

FIG. 2 illustrates a flow diagram of using a multi-layer substrate having an open area that exposes a portion of the surface of an inner layer of the substrate, in accordance with some embodiments of the disclosure.

At operation 205 of method 200, fabrication equipment provides a substrate. In some embodiments, the substrate includes a primary layer, a secondary layer, and one or more inner layers. The one or more inner layers are located between the primary layer and the secondary layer. The primary layer includes an open area that exposes a portion of a surface of an inner layer. In some embodiments, the portion of the surface of the inner layer that is exposed includes one or more wire bond pads.

At operation 210, fabrication equipment disposes a first integrated circuit die above the primary layer of the substrate. For example, the first integrated circuit die can be a flip-chip that is bonded to the primary layer of the substrate.

At operation 215, fabrication equipment disposes a second integrated circuit die above the first integrated circuit die. In some embodiments, the second integrated circuit die includes die pads.

At operation 220, fabrication equipment performs a wire bond operation that bonds first ends of conductive wires to the die pads of the second integrated circuit and bonds second ends of the conductive wires to the wire bond pads of the inner layer of the substrate. In some embodiments, a solder material is disposed on the wire bond pads of the inner layer of the substrate. The solder material bonds the second ends of the conductive wires to the wire bond pads responsive to the performance of the wire bond operation.

In some embodiments, the conductive wires are first conductive wires. The fabrication equipment performs a wire bond operation that bonds first ends of conductive wires to the die pads of the second integrated circuit and bonds second ends of the conductive wires to a second plurality of wire bond pads on the primary layer of the substrate. In some embodiments, the fabrication equipment disposes a third integrated circuit die above the second integrated circuit die. The third integrated circuit die includes die pads. In some embodiments, fabrication equipment performs a wire bond operation that bonds first ends of second conductive wires to the die pads of the third integrated circuit and bonds second ends of the second conductive wires to wire bond pads on the inner layer of the substrate.

Figure 3:
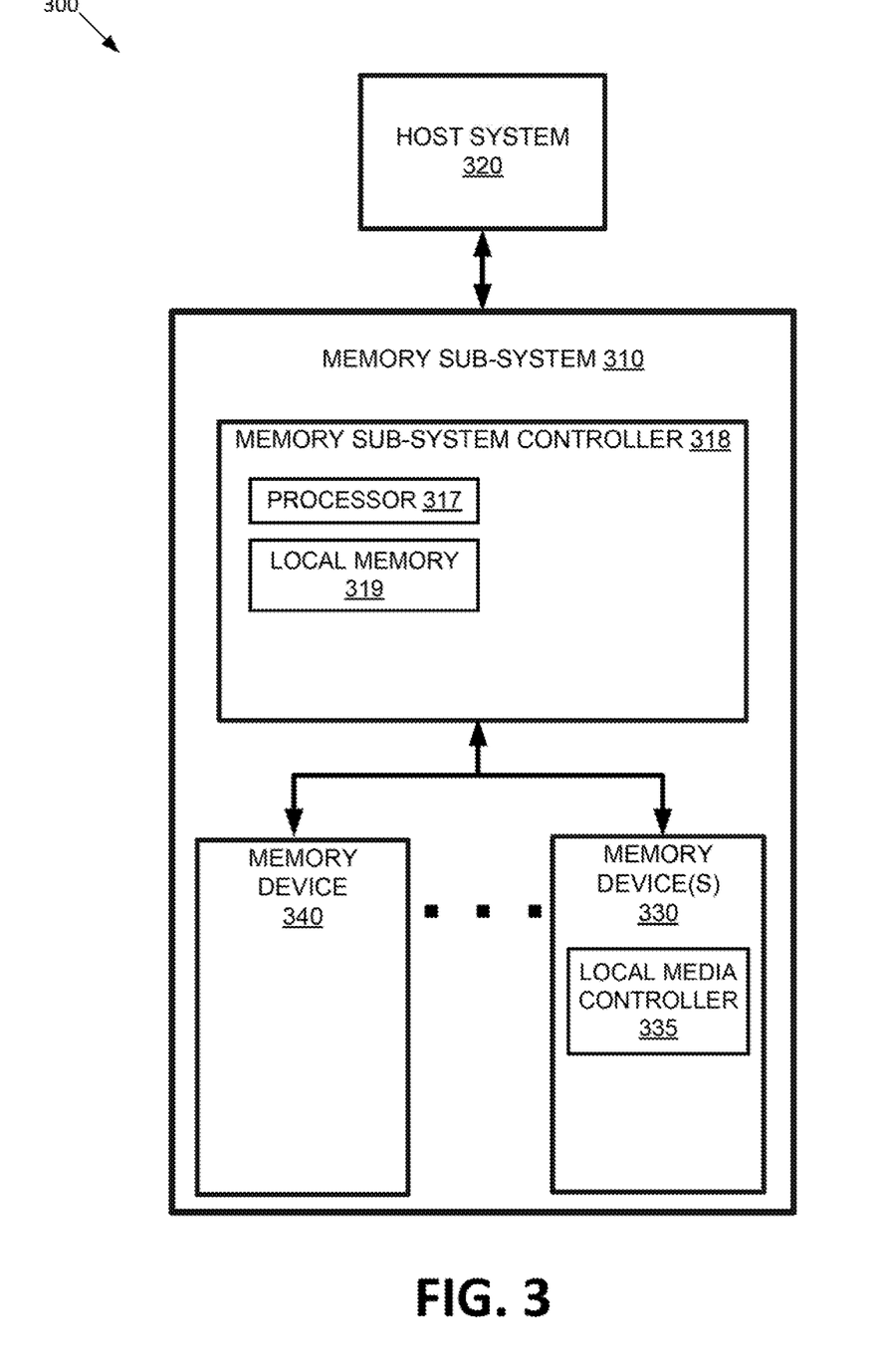
FIG. 3 illustrates an example computing system that includes a memory sub-system, in accordance with some embodiments of the present disclosure.

FIG. 3 illustrates an example computing system 300 that includes a memory sub-system 310, in accordance with some embodiments of the present disclosure. The memory sub-system 310 can include media, such as one or more volatile memory devices (e.g., memory device 340), one or more non-volatile memory devices (e.g., memory device 330), or a combination of such.

A memory sub-system 310 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 300 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 300 can include a host system 320 that is coupled to one or more memory sub-systems 310. In some embodiments, the host system 320 is coupled to different types of memory sub-systems 310. FIG. 3 illustrates one example of a host system 320 coupled to one memory sub-system 310. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 320 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 320 uses the memory sub-system 310, for example, to write data to the memory sub-system 310 and read data from the memory sub-system 310.

The host system 320 can be coupled to the memory sub-system 310 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 320 and the memory sub-system 310. The host system 320 can further utilize an NVM Express (NVMe) interface to access components (e.g., memory devices 330) when the memory sub-system 310 is coupled with the host system 320 by the PCIe interface. The physical host interface can provide an interface for passing control, address, data, and other signals between the memory sub-system 310 and the host system 320. FIG. 3 illustrates a memory sub-system 310 as an example. In general, the host system 320 can access multiple memory sub-systems via a same communication connection, multiple separate communication connections, and/or a combination of communication connections.

The memory devices 330 or 340 can include any combination of the different types of non-volatile memory devices and/or volatile memory devices. The volatile memory devices (e.g., memory device 340) can be, but are not limited to, random access memory (RAM), such as dynamic random access memory (DRAM) and synchronous dynamic random access memory (SDRAM).

Some examples of non-volatile memory devices (e.g., memory device 330) includes a negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 330 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 330 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 330 can be grouped as pages that can refer to a logical unit of the memory device used to store data. With some types of memory (e.g., NAND), pages can be grouped to form blocks.

Although non-volatile memory components such as NAND type flash memory (e.g., 2D NAND, 3D NAND) and 3D cross-point array of non-volatile memory cells are described, the memory device 330 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 318 (or controller 318 for simplicity) can communicate with the memory devices 330 to perform operations such as reading data, writing data, or erasing data at the memory devices 330 and other such operations. The memory sub-system controller 318 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 318 can be a microcontroller, special purpose logic circuitry (e.g., a field programmable gate array (FPGA), an application specific integrated circuit (ASIC), etc.), or other suitable processor.

The memory sub-system controller 318 can include a processing device 317 (processor) configured to execute instructions stored in local memory 319. In the illustrated example, the local memory 319 of the memory sub-system controller 318 includes an embedded memory configured to store instructions for performing various processes, operations, logic flows, and routines that control operation of the memory sub-system 310, including handling communications between the memory sub-system 310 and the host system 320.

In some embodiments, the local memory 319 can include memory registers storing memory pointers, fetched data, etc. The local memory 319 can also include read-only memory (ROM) for storing micro-code. While the example memory sub-system 310 in FIG. 3 has been illustrated as including the memory sub-system controller 318, in another embodiment of the present disclosure, a memory sub-system 310 does not include a memory sub-system controller 318, and can instead rely upon external control (e.g., provided by an external host, or by a processor or controller separate from the memory sub-system).

In general, the memory sub-system controller 318 can receive commands or operations from the host system 320 and can convert the commands or operations into instructions or appropriate commands to achieve the desired access to the memory devices 330 and/or the memory device 340. The memory sub-system controller 318 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 330. The memory sub-system controller 318 can further include host interface circuitry to communicate with the host system 320 via the physical host interface. The host interface circuitry can convert the commands received from the host system into command instructions to access the memory devices 330 and/or the memory device 340 as well as convert responses associated with the memory devices 330 and/or the memory device 340 into information for the host system 320.

The memory sub-system 310 can also include additional circuitry or components that are not illustrated. In some embodiments, the memory sub-system 310 can include a cache or buffer (e.g., DRAM) and address circuitry (e.g., a row decoder and a column decoder) that can receive an address from the memory sub-system controller 318 and decode the address to access the memory devices 330.

In some embodiments, the memory devices 330 include local media controllers 335 that operate in conjunction with memory sub-system controller 318 to execute operations on one or more memory cells of the memory devices 330. An external controller (e.g., memory sub-system controller 318) can externally manage the memory device 330 (e.g., perform media management operations on the memory device 330). In some embodiments, a memory device 330 is a managed memory device, which is a raw memory device combined with a local controller (e.g., local controller 335) for media management within the same memory device package. An example of a managed memory device is a managed NAND (MNAND) device.

In some embodiments, a memory device 330 can be a non-volatile memory device. In some embodiments, a non-volatile memory device is a physical package of one or more die (e.g., such as a memory device that is in its own discrete physical package with external pins or electrical contacts). A die can refer to a block of material, such as semiconducting material, on which a functional electronic circuit is fabricated. A memory device, such as memory device 330, can include one or more die. Each die can consist of one or more planes. For some types of non-volatile memory devices (e.g., negative-and (NAND) devices), each plane consists of a set of physical blocks. One or more blocks can be grouped together to form a plane of the memory component in order to allow concurrent operations (e.g., parallelism) to take place on each plane (e.g., multi-plane write). Each block consists of a set of pages. Each page consists of a set of memory cells, which store bits of data. In some embodiments, a memory cell can include one or more memory pages (also referred to herein as "logical pages" or "pages," e.g. SLC, MLC, TLC, QLC pages) for storing one or more bits of binary data corresponding to data received from a host system. For some memory devices, such as NAND devices, blocks are the smallest area than can be erased and pages within the blocks cannot be erased individually. For some memory devices, such as NAND devices, pages are the smallest area that can be written to (e.g., programmed). In some embodiments, the memory sub-system 310 includes a memory sub-system controller 318 that performs operations as described herein.

In some embodiments, the memory operations can include but are not limited to a program operation (e.g., write operation), a read operation, or an erase operation. In some embodiments, a program operation can include multiple sub-operations such as a program sub-operation, a read sub-operation, and a verify sub-operation. A program sub-operation programs data to memory cells. The data to be programmed can also be stored in one or more registers of the memory device 330. The read operation reads the data programmed to the memory cells. The verify operation compares whether the read data from the read operation matches the original data stored in the registers.

In some embodiments, any component of computing system 300 can implemented a device, such as integrated circuit device 100, as described herein. For example, memory device 330 or memory device 340 (or a combination thereof) can be implemented according to aspects of the present disclosure.

Figure 4:
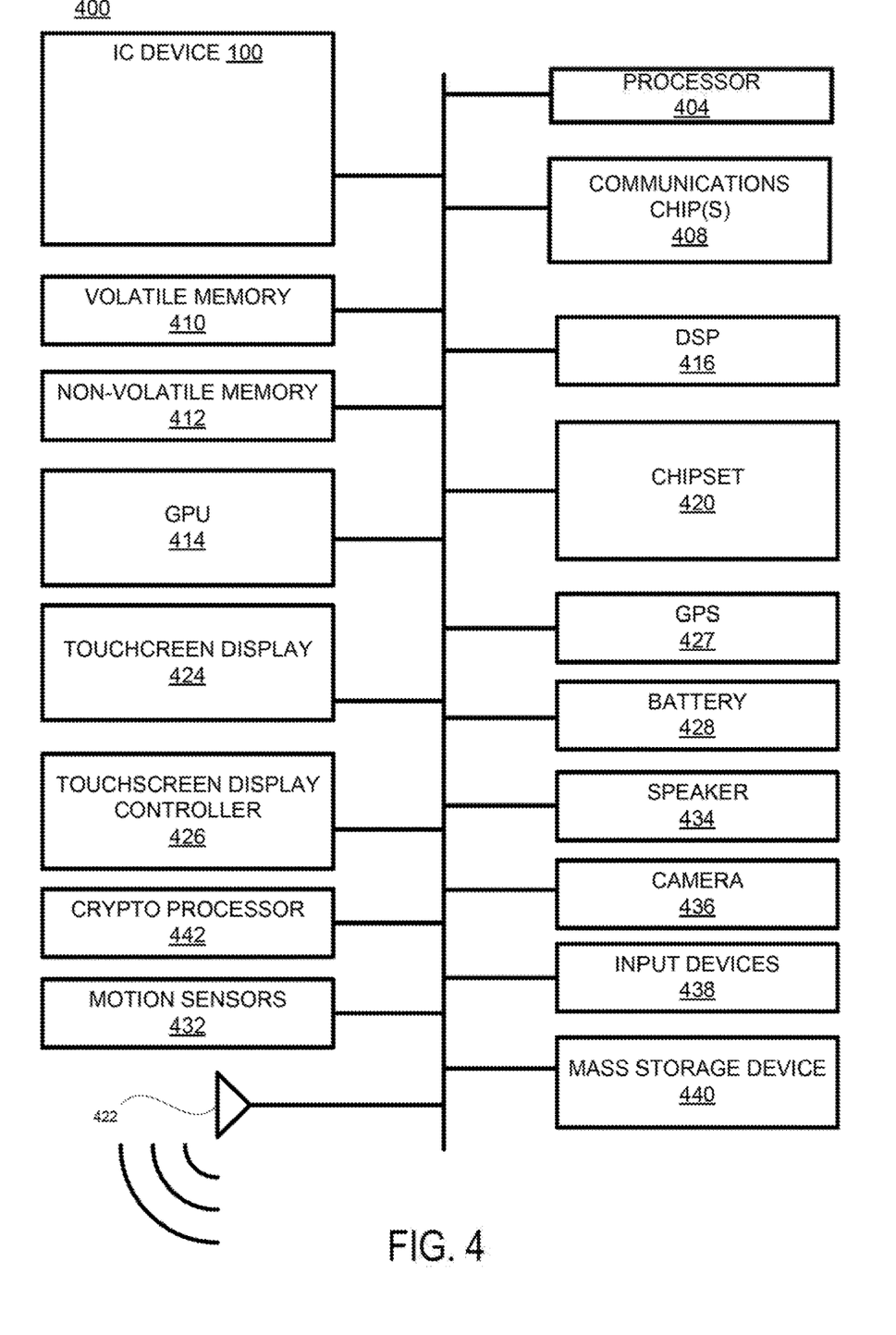
FIG. 4 is a computing device fabricated in accordance with embodiments of the disclosure.

FIG. 4 is a computing device fabricated in accordance with embodiments of the disclosure. The computing device 400 may include a number of components. In one embodiment, the components are attached to one or more circuit boards, such as a motherboard. In an alternate embodiment, some or all of these components are fabricated onto a single system-on-a-chip (SoC) die, such as an SoC used for mobile devices. In embodiments, the components in the computing device 400 include, but are not limited to, an integrated circuit device 100 and at least one communications logic unit 408. In some embodiments, the communications logic unit 408 is fabricated in a separate integrated circuit chip that may be bonded to a substrate or motherboard that is shared with or electrically coupled to the integrated circuit device 100. It may be noted that in some embodiments integrated circuit device 100 can include any number or type of integrated circuit dice.

Computing device 400 may include other components that may or may not be physically and electrically coupled to the motherboard or fabricated within an SoC die. These other components include, but are not limited to, volatile memory 410 (e.g., DRAM), non-volatile memory 412 (e.g., ROM or flash memory), a graphics processing unit 414 (GPU), a digital signal processor 416, a crypto processor 442 (e.g., a specialized processor that executes cryptographic algorithms within hardware), a chipset 420, at least one antenna 422 (in some embodiments two or more antenna may be used), a display or a touchscreen display 424, a touchscreen controller 426, a battery 428 or other power source, a power amplifier (not shown), a voltage regulator (not shown), a global positioning system (GPS) device 427, a compass (not shown), a motion coprocessor or sensors 432 (that may include an accelerometer, a gyroscope, and a compass), a microphone (not shown), a speaker 434, a camera 436, user input devices 438 (such as a keyboard, mouse, stylus, and touchpad), and a mass storage device 440 (such as hard disk drive, compact disk (CD), digital versatile disk (DVD), and so forth). The computing device 400 may incorporate further transmission, telecommunication, or radio functionality not already described herein. In some embodiments, the computing device 400 includes a radio that is used to communicate over a distance by modulating and radiating electromagnetic waves in air or space. In further embodiments, the computing device 400 includes a transmitter and a receiver (or a transceiver) that is used to communicate over a distance by modulating and radiating electromagnetic waves in air or space.

The communications logic unit 408 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 408 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 400 may include a multitude of communications logic units 408. For instance, a first communications logic unit 408 may be dedicated to shorter range wireless communications such as Wi-Fi, NFC, and Bluetooth and a second communications logic unit 408 may be dedicated to longer range wireless communications such as GPS, EDGE, GPRS, CDMA, WiMAX, LTE, Ev-DO, and others.

The processor 404 (also referred to "processing device" herein) may refer to any device or portion of a device that processes electronic data from registers and/or memory to transform that electronic data into other electronic data that may be stored in registers and/or memory. Processor 404 represents one or more general-purpose processing devices such as a microprocessor, a central processing unit, or the like. More particularly, the processor 404 may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 404 may also be one or more special-purpose processing devices such as an application specific integrated circuit (ASIC), a field programmable gate array (FPGA), a digital signal processor (DSP), network processor, or the like.

In various embodiments, the computing device 400 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further embodiments, the computing device 400 may be any other electronic device that processes data.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms or operations presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the disclosure is not described with reference to any particular programming language. It will be appreciated that a variety of programming languages can be used to implement the teachings of the disclosure as described herein.

The disclosure can be provided as a computer program product, or software, that can include a machine-readable medium having stored thereon instructions, which can be used to program a computer system (or other electronic devices) to perform a process according to the disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an embodiment" or "one embodiment" or "an implementation" or "one implementation" or the like throughout may or may not mean the same embodiment or implementation. One or more embodiments or implementations described herein may be combined in a particular embodiment or implementation. The terms "first," "second," "third," "fourth," etc. as used herein are meant as labels to distinguish among different elements and may not necessarily have an ordinal meaning according to their numerical designation.

Spatially relative terms, such as "over," "above" "under," "between," and "on" as used herein refer to a relative position of one material layer or component with respect to other layers or components. For example, one layer disposed above or over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers. Unless otherwise specified, the spatially relative terms are not intended to be limiting to the absolute orientation, and are intended to encompass different orientations (e.g., rotated 90 degrees, inverted, flipped) of the layers or components in addition to the orientation depicted in the Figures. For example, if layers in the Figures are inverted, layers described as "above" or "on top of" other layers or components can then be considered oriented "below" or "on bottom of" the other layers or components, without deviating from aspects of the disclosure.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
   an integrated circuit; and
   a substrate coupled to the integrated circuit, the substrate comprising:
   a primary layer comprising a first surface that is a first external surface of the substrate, and wherein the primary layer is associated with an open area that extends through the primary layer;
   a secondary layer comprising a second surface that is a second external surface of the substrate, wherein the secondary layer comprises a plurality of electrical contacts; and an inner layer that is located between the primary layer and the secondary layer, wherein the inner layer comprises a third surface that is orientated approximately parallel to the first surface of the primary layer, wherein a portion of the third surface of the inner layer is exposed via the open area associated with the primary layer, and wherein the inner layer comprises a first plurality of wire bond pads that are exposed via the open area associated with the primary layer.

2. The apparatus of claim 1, the substrate further comprising:
a second plurality of wire bond pads disposed on the first surface of the primary layer.

3. The apparatus of claim 2, wherein a first subset of the plurality of electrical contacts is configured to couple to the first plurality of wire bond pads of the inner layer, and wherein a second subset of the plurality of electrical contacts of the secondary layer is configured to couple to the second plurality of wire bond pads of the primary layer.

4. The apparatus of claim 2, further comprising:
a plurality of die pads disposed on the integrated circuit;
a first plurality of conductive wires comprising first ends and second ends, wherein the first ends of the first plurality of conductive wires are bonded to a first subset of the plurality of die pads, and wherein the second ends of the first plurality of conductive wires are bonded to the first plurality of wire bond pads of the inner layer that is exposed via the open area associated with the primary layer; and
a second plurality of conductive wires comprising first ends and second ends, wherein the first ends of the second plurality of conductive wires are bonded to a second subset of the plurality of die pads, and wherein the second ends of the second plurality of conductive wires are bonded to the second plurality of wire bond pads disposed on the first surface of the primary layer.

5. The apparatus of claim 3, further comprising:
a solder material that is disposed above the first plurality of wire bond pads, wherein the solder material bonds the first plurality of wire bond pads to a first plurality of conductive wires.

6. The apparatus of claim 1, wherein the inner layer is a first inner layer, the substrate further comprising:
a second inner layer that is located between the primary layer and the secondary layer.

7. The apparatus of claim 6, wherein the second inner layer is located between the first inner layer and the secondary layer.

8. The apparatus of claim 6, wherein the second inner layer is located between the first inner layer and the primary layer, wherein the second inner layer is associated with an open area that extends through the second inner layer and that is oriented to overlap with the open area associated with the primary layer, and wherein the first inner layer is exposed via the open area associated with the second inner layer.

9. The apparatus of claim 6, wherein a conductive layer is disposed between the primary layer and the first inner layer, wherein the conductive layer is associated with an open area that is orientated to overlap with the open area associated with the primary layer, and wherein the conductive layer is configured to provide shielding from electromagnetic interference.

10. The apparatus of claim 2, wherein the integrated circuit is a stacked integrated circuit comprising a plurality of dice, wherein a first die of the plurality of dice is stacked above a second die of the plurality of dice, wherein a die pad of the first die is bonded to a wire bond pad of the first plurality of wire bond pads of the inner layer, and wherein a die pad of the second die is bonded to a wire bond pad of the second plurality of wire bond pads disposed on the first surface of the primary layer.

11. The apparatus of claim 2, wherein the first plurality of wire bond pads are arranged in a first row of wire bond pads, wherein the second plurality of wire bond pads are arranged in a second row of wire bond pads, and wherein an alignment of wire bond pads of the first row of wire bond pads is offset from corresponding wire bond pads of the second row of wire bond pads.

12. A system comprising:
a printed circuit board;
a processing device coupled to the printed circuit board; and
a memory device coupled to the printed circuit board, the memory device comprising:
an integrated circuit; and
a substrate coupled to the integrated circuit, the substrate comprising:
a primary layer comprising a first surface that is a first external surface of the substrate, and wherein the primary layer is associated with an open area that extends through the primary layer;
a secondary layer comprising a second surface that is a second external surface of the substrate, wherein the second surface of the secondary layer comprises a plurality of electrical contacts; and
an inner layer that is located between the primary layer and the secondary layer, wherein the inner layer comprises a third surface that is orientated approximately parallel to the first surface of the primary layer, wherein a portion of the third surface of the inner layer is exposed via the open area associated with the primary layer, and wherein a first plurality of wire bond pads are disposed on the portion of the third surface of the inner layer that is exposed via the open area associated with the primary layer.

13. The system of claim 12, wherein the memory device further comprises:
a second plurality of wire bond pads disposed on the first surface of the primary layer.

14. The system of claim 13, wherein a first subset of the plurality of electrical contacts is configured to couple to the first plurality of wire bond pads disposed on the portion of the third surface of the inner layer, and wherein a second subset of the plurality of electrical contacts of the secondary layer is configured to couple to the second plurality of wire bond pads disposed on the first surface of the primary layer.

15. The system of claim 13, the memory device further comprising:
a plurality of die pads disposed on the integrated circuit;
a first plurality of conductive wires comprising first ends and second ends, wherein the first ends of the first plurality of conductive wires are bonded to a first subset of the plurality of die pads, and wherein the second ends of the first plurality of conductive wires are bonded to the first plurality of wire bond pads disposed on the portion of the third surface of the inner layer that is exposed via the open area associated with the primary layer; and
a second plurality of conductive wires comprising first ends and second ends, wherein the first ends of the second plurality of conductive wires are bonded to a second subset of the plurality of die pads, and wherein the second ends of the second plurality of conductive wires are bonded to the second plurality of wire bond pads disposed on the first surface of the primary layer.

16. The system of claim 12, wherein the inner layer is a first inner layer, the substrate further comprising:
a second inner layer that is located between the primary layer and the secondary layer.

17. The method of claim 16, further comprising:
performing a wire bond operation that bonds first ends of conductive wires to a plurality of die pads of the second integrated circuit and bonds second ends of the conductive wires to the first plurality of wire bond pads of the inner layer of the substrate.

18. The method of claim 17, wherein a solder material is disposed on the first plurality of wire bond pads of the inner layer of the substrate, and wherein the solder material bonds the second ends of the conductive wires to the first plurality of wire bond pads based on the wire bond operation.

19. A method comprising:
providing a substrate comprising a primary layer, a secondary layer, and an inner layer, wherein the inner layer is located between the primary layer and the secondary layer, wherein the primary layer is associated with an open area that exposes the inner layer and a first plurality of wire bond pads of the inner layer;
disposing a first integrated circuit die above the primary layer of the substrate; and
disposing a second integrated circuit die above the first integrated circuit die.

20. The method of claim 19, the method further comprising:
performing a wire bond operation that bonds first ends of first conductive wires to a plurality of die pads of the second integrated circuit and bonds second ends of the first conductive wires to a second plurality of wire bond pads on the primary layer of the substrate;
disposing a third integrated circuit die above the second integrated circuit die, wherein the third integrated circuit die comprised a plurality of die pads; and
performing a wire bond operation that bonds first ends of second conductive wires to the plurality of die pads of the third integrated circuit and bonds second ends of the second conductive wires to the first plurality of wire bond pads of the inner layer.

* * * * *